Figure 1:
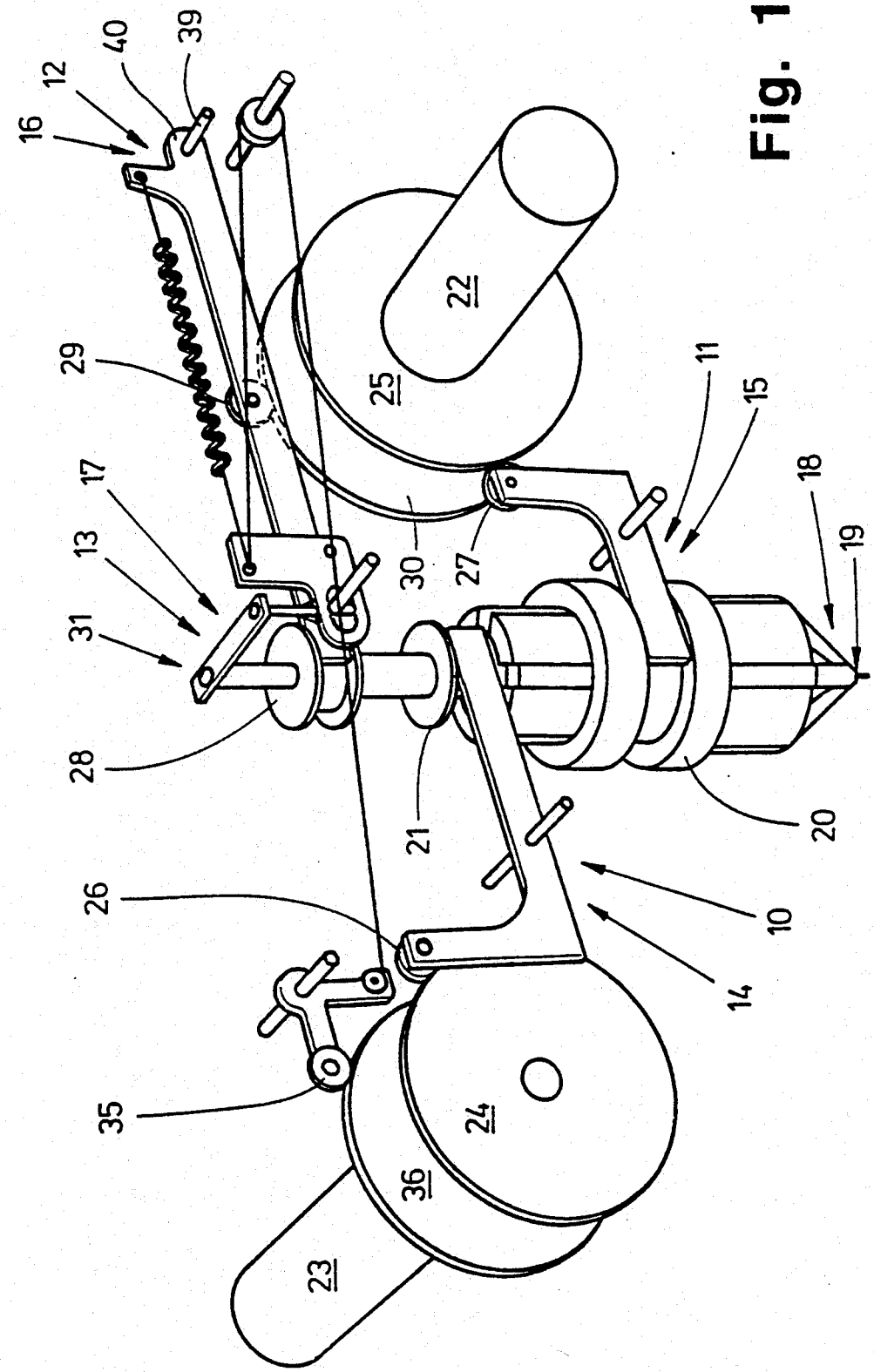

United States Patent [19]

Rauscher

[11] Patent Number: 5,228,732
[45] Date of Patent: Jul. 20, 1993

[54] ASSEMBLY HEAD FOR HANDLING DEVICES

[75] Inventor: Erich Rauscher, Munich, Fed. Rep. of Germany

[73] Assignee: Arnold & Richter Cine Technik GmbH & Co. Betriebs KG, Fed. Rep. of Germany

[21] Appl. No.: 752,616
[22] PCT Filed: Feb. 14, 1990
[86] PCT No.: PCT/DE90/00104
 § 371 Date: Oct. 15, 1991
 § 102(e) Date: Oct. 15, 1991
[87] PCT Pub. No.: WO90/09732
 PCT Pub. Date: Aug. 23, 1990

[30] Foreign Application Priority Data

Feb. 16, 1989 [DE] Fed. Rep. of Germany ....... 3904587

[51] Int. Cl.[5] .................. B66C 1/02; H05K 13/04
[52] U.S. Cl. .............................. 294/2; 294/64.1; 294/116; 29/743
[58] Field of Search ........................ 294/2, 64.1, 116; 29/740, 743, 759; 901/40; 414/737, 752

[56] References Cited

U.S. PATENT DOCUMENTS 3,857,496 12/1974 Gonzales ............... 901/40 X
4,705,311 11/1987 Ragard ................... 294/2
4,753,004 6/1988 Fujioka ................ 294/64.1 X
4,770,599 9/1988 Hawkswell ............. 294/2 X
4,950,011 8/1990 Borcea et al. .......... 294/2
5,033,185 7/1991 Hidese ............... 29/743 X

FOREIGN PATENT DOCUMENTS 20002 12/1980 European Pat. Off. .
67233 12/1982 European Pat. Off. .
3217672 11/1983 Fed. Rep. of Germany .
664110 2/1988 Switzerland .

Primary Examiner—Margaret A. Focarino
Assistant Examiner—Dean J. Kramer
Attorney, Agent, or Firm—Jenner & Block

[57] ABSTRACT

An assembly head for handling devices for programmed automatic mounting of components on a workpiece, in particular for assembling electronic components on printed circuit boards, comprises a sleeve which slides longitudinally in the central bore of a rotary star mounted in the assembly head, at least one pair of tongs which pivot in the direction of a suction pipette arranged at the lower end of the sleeve and which hold and adjust the components, and an ejection device which is guided in the sleeve and actuated by a transmission mechanism in synchronization with the movement of the sleeve so as to eject a component held by the assembly head and to stop the suction of the suction pipette. The ejection device guided in the sleeve can be actuated by a control element acted on by a tensile load.

18 Claims, 7 Drawing Sheets

ASSEMBLY HEAD FOR HANDLING DEVICES

The invention concerns a device of the type named in the preamble.

The assembly heads used in the assembly technology for handling devices for the programmed automatic mounting of components on a workpiece, particularly to assemble electronic components (SMD components) on printed circuit boards, usually are provided with several independent axes which are driven by pilot motors in order to activate individual function units, such as grab tongs, by transmission mechanisms.

An assembly head is known from DE-PS 32 17 672 where several function units are activated by transmission mechanisms, either independently or coupled together. These function units consist of a rotary star which can be rotated 360 degrees, two pairs of tongs attached thereto, a sleeve, which can be moved longitudinally and which is guided in a central bore of the rotary star, and an ejection device which serves to eject components held by vacuum on the suction pipette, or to vacuum seal the suction pipette.

The ejection device, like the pairs of tongs and the sleeve which can be moved longitudinally, is activated by a transmission mechanism, whose movement is controlled by a cam disc. Since the ejection device is to be activated in dependence longitudinally movable sleeve's stroke position, the transmission mechanisms of the ejection device and of the sleeve are coupled.

The transmission mechanism of the ejection device, like the other transmission mechanisms, consists of different solidly designed transmission links. Due to its solid design the transmission mechanism of the ejection device constitutes a considerable part of the mass to be moved by the sleeve with every stroke movement. Since the maximum stroke frequency of the sleeve is limited by the inertial forces which occur, and which lead to harmful excitation of vibrations in the assembly head, this solid design of the transmission mechanism has a negative impact on the number of pieces which can be obtained in the production of printed circuit boards.

The task of the invention is to develop an assembly head of the type described above in such a way that by reducing the actuated mass a higher stroke frequency can be obtained, and yet a safe and trouble-free operation of the assembly head is possible.

This task is solved with the characteristics of claim 1.

Activating the ejection device by a control element acted on by a tensile load makes operation easier, simply with tensile load materials for the use as control element. This results in a considerable reduction of the mass to be actuated by the sleeve and therefore the possibility to increase the maximum stroke frequency.

According to an advantageous development of the invention, the control element is a component of the transmission mechanism which is articulated to the frame of the assembly head to activate the ejection device. In order to form a solid connection the control element is connected with a rotary lever which is actuated by a disc cam and which activates the ejection device by a push-rod, whereby the lever is rotatably connected with a stroke lever in a swivel joint, which makes the movement of the sleeve possible.

Here, it is of advantage to use, aside from the transmission mechanism, only small push-rods with a minimal stroke as well as a rotary lever, which is connected with the existing stroke lever to move the sleeve and which acts directly on the push-rods, instead of solid expansive levers which are arranged girder-like in the assembly head.

In a preferred design example the control element is designed as a steel band. This makes a flexible design of the control element possible, which also allows adaption to limited installation space.

For an advantageous space-saving arrangement of the transmission mechanism elements the control lever and the stroke lever are arranged opposite each other on either side of the sleeve, whereby the steel band is redirected in the area of the swivel bearing which houses the stroke lever.

According to an advantageous development of the invention the rotary lever is arranged parallel to the stroke lever which is articulated to a stroke ring by axle necks for the longitudinal movement of the sleeve, so that it houses the axle necks in slots on its arms and brings them to the middle of the ejection device's axial stroke movement.

Parallel to the stroke lever an adjustable compression spring is attached thereto, which acts on an articulation point of the steel band on the rotary lever, which forces this latter into an knee-point position toward the stroke lever, which acts as a stop for the swivel movement of the rotary lever. The stroke movement of the ejection device takes place against the effect of this compression spring. At the same time, the springiness causes a pre-stressing of the steel band.

According to an advantageous development the steel band's angle of contact ends at the neutral point of a swivel bearing which serves to house the stroke lever. This achieves that there is no change in tension in the steel band when the stroke lever is rotated.

In a further preferred design example the control element is designed as an actuator lever. This creates a control element which is particularly simple to design.

According to an advantageous development the actuator lever connects the control lever with a rotary lever, which in turn is connected to a rod, which is loaded by a compression spring, and articulated to the rotary lever through a joint connection. Preferably the joint connection consists of a joint plug of the rotary lever, guided in a slot in the rod. This special joint connection design achieves that, independent from harmful tolerances in the transmission mechanism's kinematics, the rotary lever is always relieved from strain when the ejection device is not in use, because the tolerances are balanced by the joint plug's clearance in the slot. This constructive measure also ensures that the ejection device is loaded by the entire resilience of the tension spring and that the vacuum seal is tightly closed.

According to an advantageous characteristic the tension spring is guided on the rod, whereby one of its ends is hooked into the rod and the other end is hooked to a thrust bearing which is connected to the stroke lever.

According to another advantageous design of the invention the sleeve, which houses the ejection device, is guided in rolling bearings in an upper and lower sleeve housing of the assembly head and can be moved longitudinally.

This prevents that control moments influencing the sleeve, possibly through the transmission mechanism, particularly the rotary lever, cause the sleeve in the bearing to be canted as is possible in a sliding guide.

The sleeve, is guided both in the upper sleeve guide as well as in the lower sleeve guide, which are arranged at either end of the sleeve, on ball bearings and can be moved longitudinally. The large bearing, which has thus been created, permits even higher lateral loads of the sleeve to be handled safely by the bearings.

The sleeve, which has an annulus cross section in the area of the upper sleeve guide, is guided in three ball bearings, which are spaced evenly around the sleeve, in a bearing holder, which in turn is held in a ball ring guide for radial pivoting. In the area of the lower sleeve guide the sleeve has a square cross section and is guided in four ball bearings which are assigned to the respective corners of the square cross section. In the corners of the cross section steel pins are provided, which extend in the sleeve's longitudinal direction, on which the ball bearings roll.

Two of the ball bearings in the area of the lower sleeve guide are designed as prestressed double ball bearings, each of which is provided with a guide ring on its outer rings, at least one of which is provided with a V-shaped cut cross section for a two-point installation to a steel pin. In respect of their distance to the sleeve's longitudinal axis, the ball bearings are adjustable. The two-point installation of a guide ring to a steel pin, together with the adjustment of the radial pressure of the bearing on the steel pins, enables a precise alignment of sleeve and rotary star around their common longitudinal axis.

In addition, the two-point installation allows a precise grip without disturbing the easy linear track of the sleeve which is due to the steel pins and the ball bearings.

Figure 2:
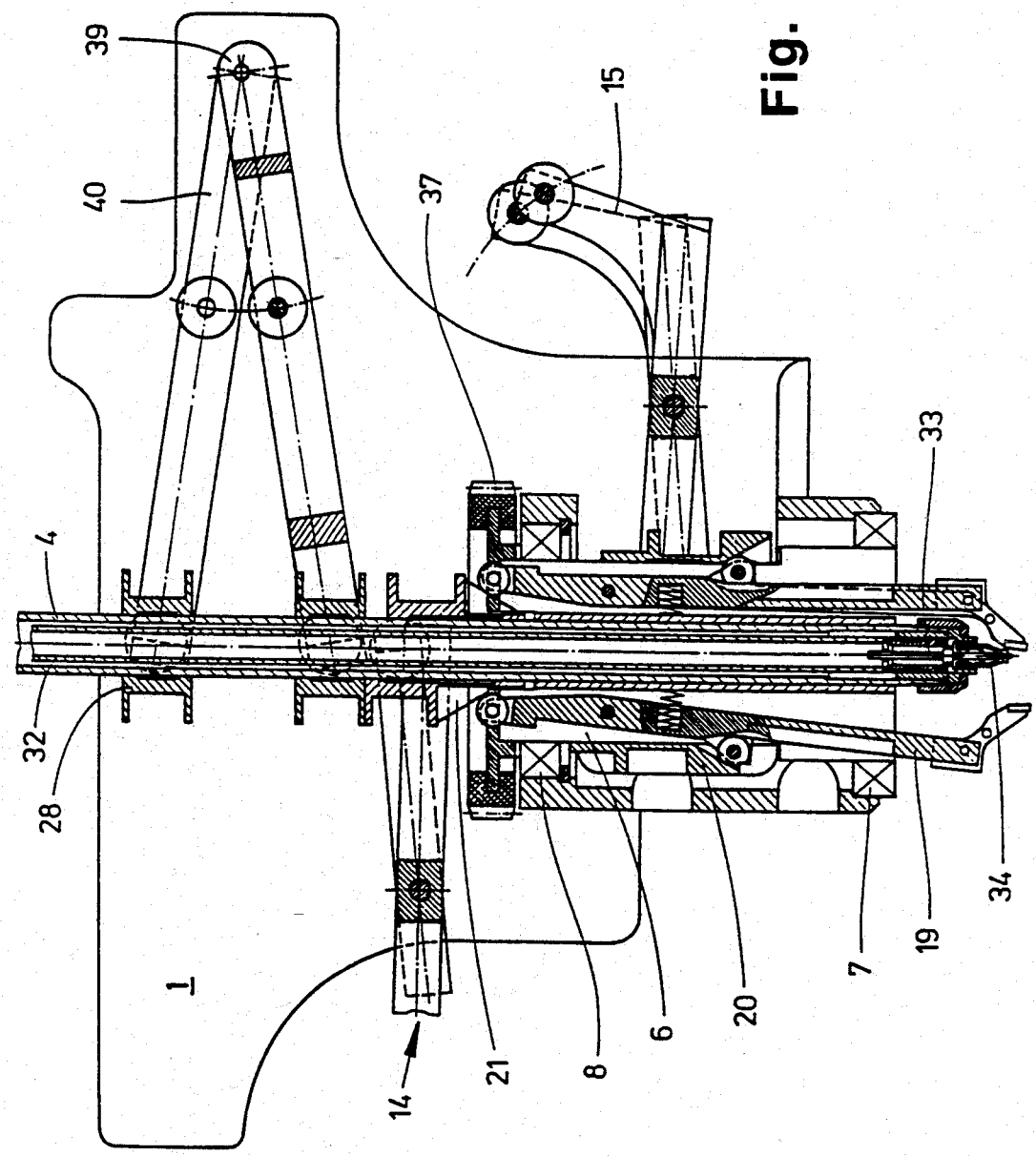
Figure 3:
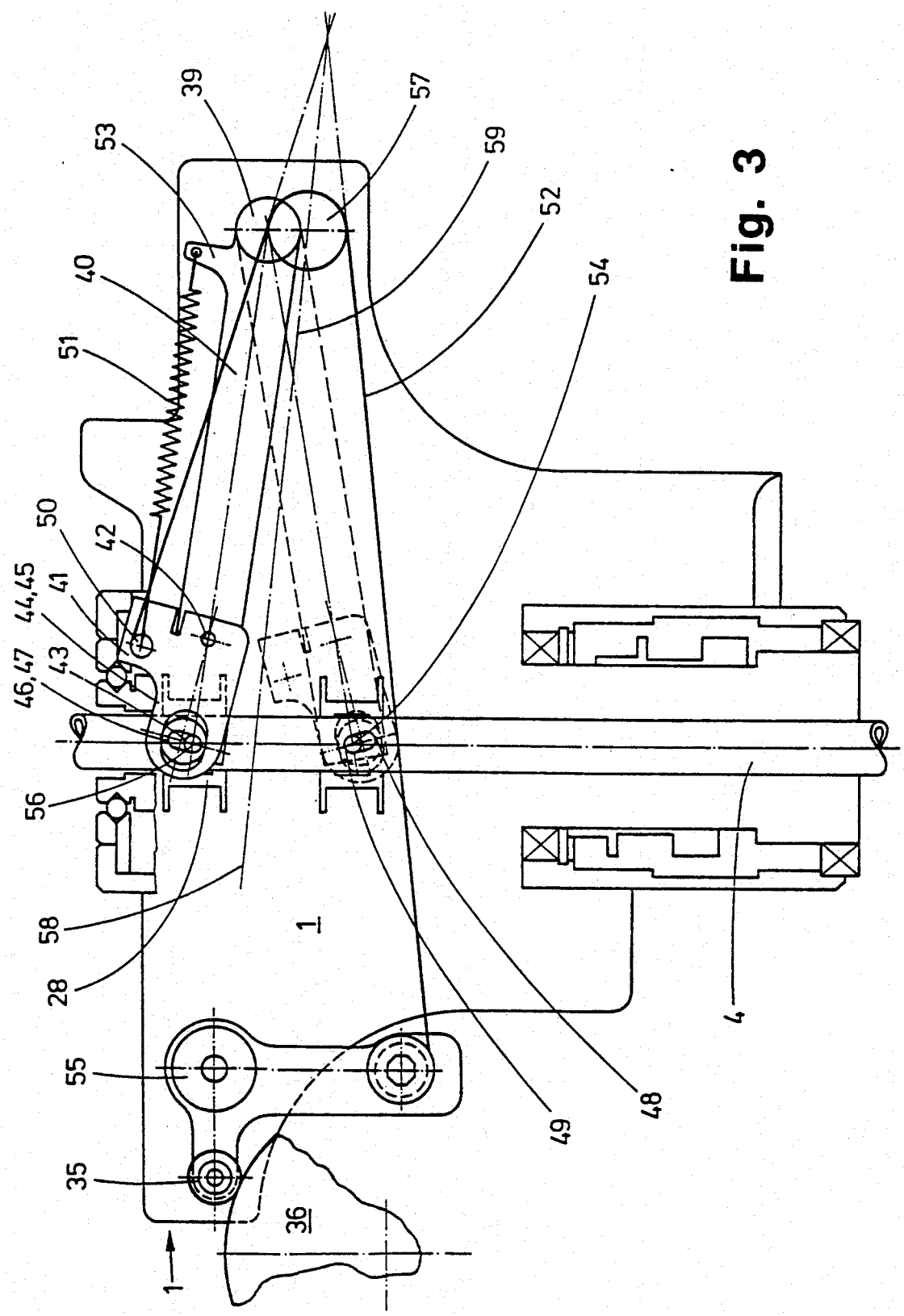
Figure 4:
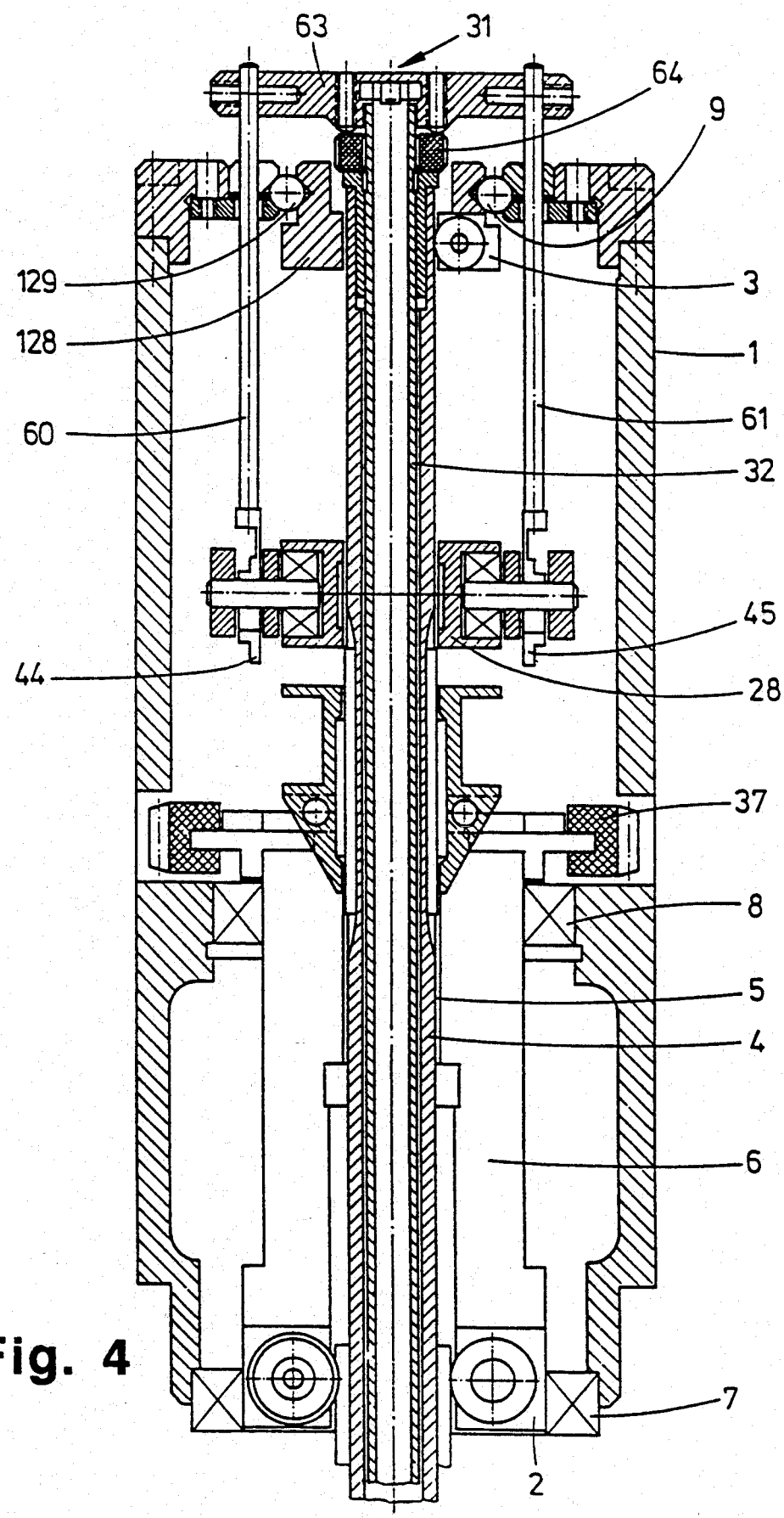
Figure 5:
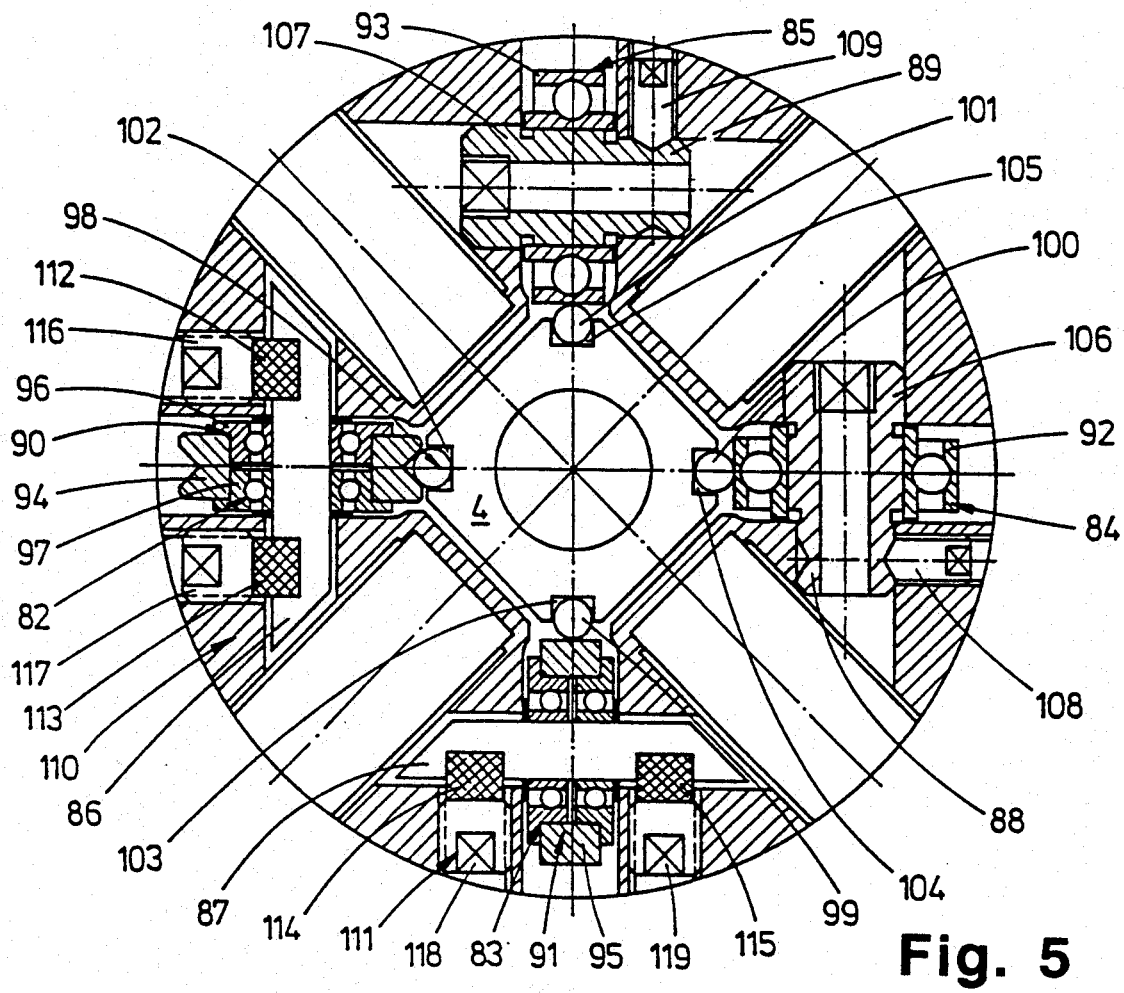
Figure 6:
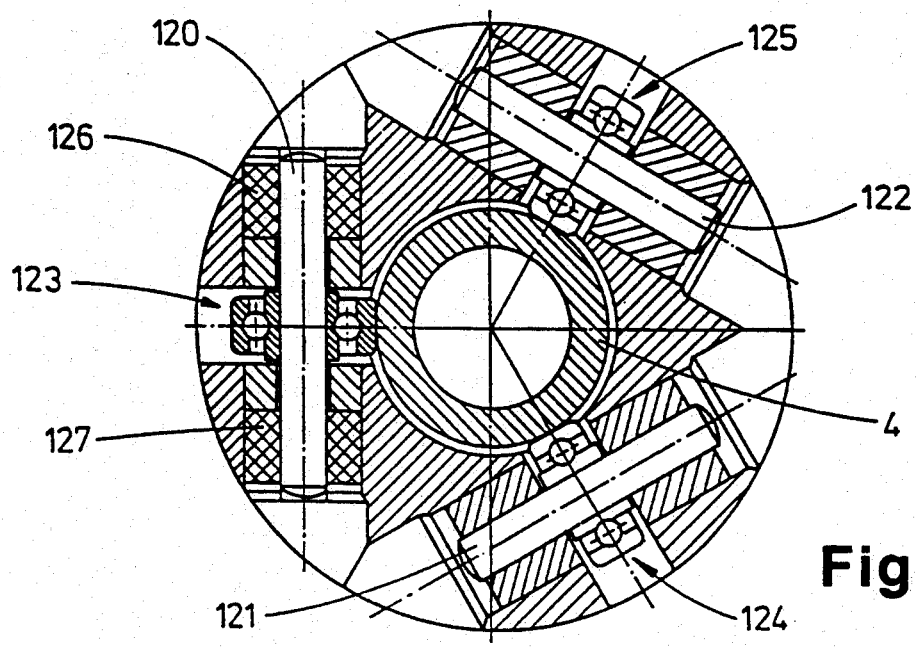
Figure 8:
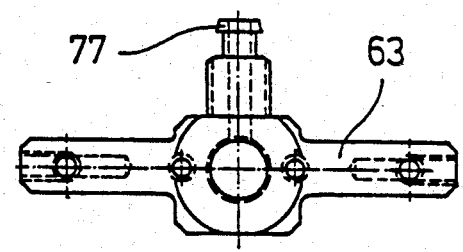
Figure 7:
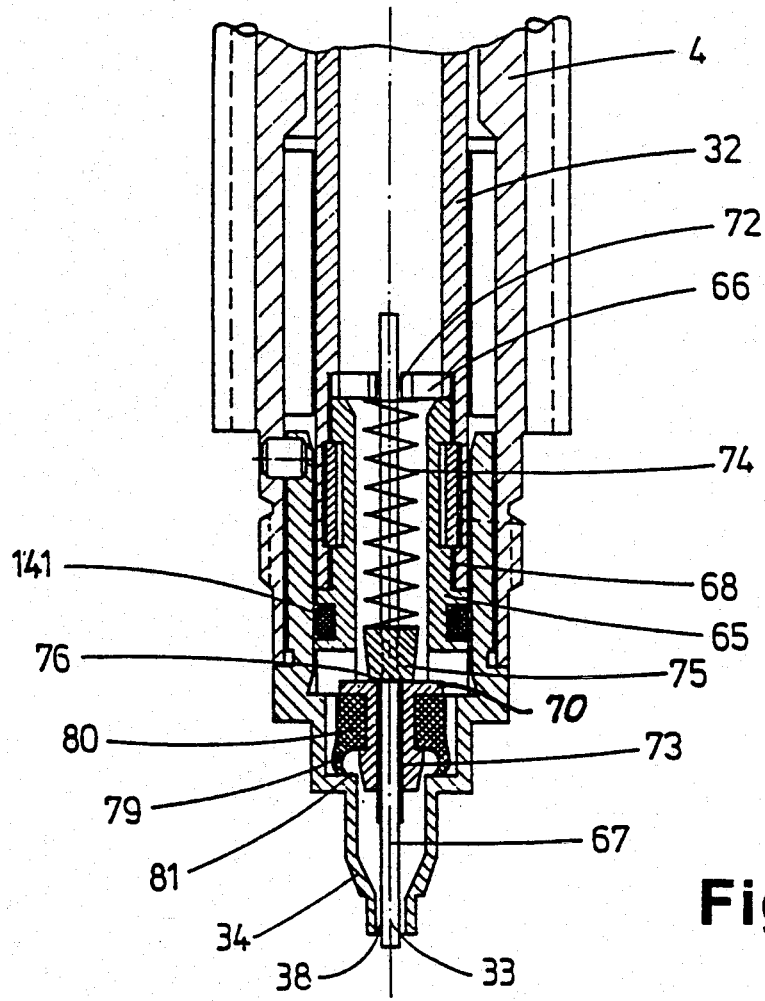
Figure 9:
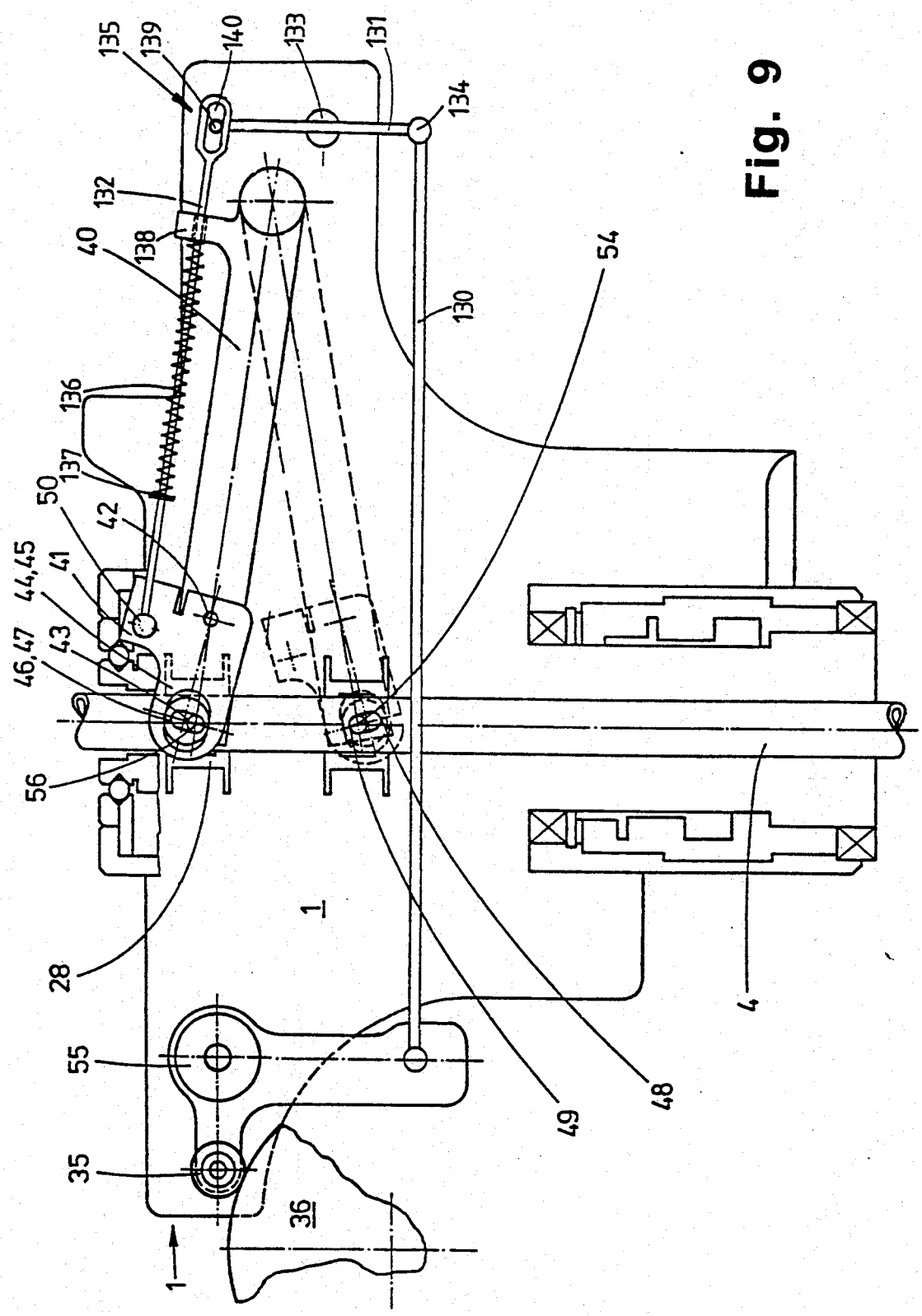

Additional advantageous developments of the invention, together with the preferred design examples are shown below based on the drawings. They show:

FIG. 1 an assembly head with ejection device in schematic view,

FIG. 2 the assembly head in a sectional view,

FIG. 3 a transmission mechanism, provided with a steel band to activate the ejection device, FIG. 4 a longitudinal section of the sleeve hold, FIG. 5 a lower sleeve guide, FIG. 6 an upper sleeve guide, FIG. 7 an ejection device, FIG. 8 a yoke to activate the ejection device, and FIG. 9 a transmission mechanism provided with an actuator lever.

The assembly head, shown in perspective and in sectional view in FIGS. 1 and 2, for the mounting of electronic components on printed circuit boards, consists essentially of a frame 1, in which a sleeve 4 is arranged which is held by a lower and an upper sleeve guide 2, 3, and which is guided through a central bore 5 of a rotary star 6.

Both the lower sleeve guide 2 and the upper sleeve guide 3 as well as the rotary star 6 are housed in rolling bearings 7, 8, 9 opposite the frame 1 of the assembly head and can be rotated. Opposite the rotary star 6 the sleeve 4 is guided so that it can be moved longitudinally and is resistant to torsion.

For picking up and subsequent placing of electronic components on printed circuit boards the assembly head is provided with different function units 10, 11, 12 and 13 which are driven by different transmission mechanisms 14, 15, 16, 17 to carry out the programmed operating phases.

The function units 10, 11, which are rotatably connected with the rotary star 6, are designed as pairs of tongs 18, 19 which are actuated by the transmission mechanisms 14, 15, both couplings 20, 21 guided longitudinally movable on the rotary star 6. The transmission mechanisms' 14, 15 movements thereby are controlled by cam discs 24, 25, driven by pilot motors 22, 23, on which scanning rolls 26, 27 of the transmission mechanisms 14, 15 are guided.

In order to carry out a stroke movement, a stroke ring 28, which is firmly connected to the sleeve 4, is articulated to the transmission mechanism 16, whose scanner roll 29 runs along a cam disc 30, driven by the pilot motor 23 to control the stroke movement.

In the sleeve 4 an axially movable ejection pipe 32 is guided as a component of the ejection device 31 forming the function unit 13, which, at its lower end, houses an ejector 33 which is guided in that end of the sleeve 4, which is formed by a suction pipette 34.

In order to activate the ejection device 31, the ejection pipe 32 is longitudinally moved in the sleeve 4 in the direction of the suction pipette 34 by means of the transmission mechanism 17 whose movements are controlled by the scanning of a scanner roll 35 on a cam disc 36.

The entire sequence of movements carried out by the assembly head is divided into several consecutive steps. First occurs the alignment of the rotary star 6 by a corresponding drive of a toothed wheel 37 or a toothed belt wheel, respectively, which is connected to the rotary star 6, in such a way, that the pairs of tongs 18, 19 are aligned radially to the component to be taken up in a manner which permits the component to be taken up.

Following that, the sleeve 4, together with the ejection device 31 is moved by the transmission mechanism 16 in the direction of the component to be taken up, whereby the ejection pipe 32 with the ejector 33 is moved upwards by a stroke, triggered by the transmission mechanism 17, to free a suction bore 38 of the suction pipette 34. Due to the vacuum which now exists on the suction pipette 34, the component is sucked up and moved into an upper sleeve position, together with the sleeve 4.

Here, the pairs of tongs 18, 19 are activated consecutively by the transmission mechanisms 14, 15 in order to center and hold the component. At the same time, an electric check and identification of the component occurs through the pair of tongs 19.

When the assembly head is located in the correct release position above the printed circuit board on which the component is to be mounted, the pairs of tongs 18, 19 are opened and the component, together with the sleeve, is moved in the direction of the printed circuit board until it is positioned upon it with a defined force. In this position, a stroke of the ejection device 31 in the direction of the suction pipette 34 shuts off the vacuum thereon, and the ejector 33 ejects the component from the suction pipette 34.

Aside from the short stroke movements used to move the ejection pipe 32 within the framework of the total sequence of movements of the assembly head, the ejection pipe 32 is moved in synchronization with the sleeve 4 without relative movement thereto. Due to a swivel movement of a stroke lever 40, which is guided in a swivel bearing 39 in the frame 1 of the assembly head and articulated to the sleeve 4 by means of a stroke ring 28, the sleeve is therefore axially moved.

The transmission mechanism 17 used to accomplish the stroke movement of the ejection device 31 is coupled with the transmission mechanism 16 through a rotary lever 41, which is rotatably articulated to the stroke lever 40 in a swivel joint 42 in such a way that axle necks 43, which are provided on the stroke ring 28 for the connection with the stroke lever 40, are guided through the slots 46, 47 or free holes, respectively, which are arranged in the arms 44, 45 of the rotary lever 41.

In a preferred design example the rotary lever 41 is pressurized with a compression spring 51 as well as with a steel band 52 which is acted on by tensile force on an articulation point 50, to accomplish a back and forth swivel movement. A thrust bearing 53 of the compression spring 51 is arranged on the stroke lever 40, so that the rotary lever 41 is forced into a knee-point position towards the stroke lever 40. Push-rods 60, 61, together with the rotary lever 41, which are connected to the ejection pipe 32 through a yoke 63, are moved downward, so that the sealing lip 79 of a seal ring 80, which is located in the ejection device 31, which is connected to the ejection pipe 32, is pressed against a pipette recess 81 to seal the vacuum.

With a swivel movement of the control lever 55, controlled through the cam disc 36, a tensile force, which is reverse to the compression spring 51, acts on the articulation point 50 of the steel band 52 on the rotary lever 41 through the steel band which is connected with the control lever 55, and causes the rotary lever 41 to swivel in the direction of the tensile load.

For optimal utilization of the limited space available in the frame 1 of the assembly head the transmission mechanism 17 elements are arranged on opposite sides of the sleeve 4. The necessary redirection of the steel band 52 occurs at a redirection point 57, which is located below the swivel bearing 39 of the stroke lever 40. At the same time, the connecting line 59 between the redirection point 57 and a stroke mid-point 58 of the sleeve 4 represents the bisector of the angle of contact of the steel band 52 around the redirection point 57. This ensures that the tensile loads of the steel band 52 are equal both in the lower dead position 54 and in the upper dead position 56, and no longitudinal movement occurs.

To transmit the swivel movement of the rotary lever 41 to the ejection pipe 32 of the ejection device 31 two pushrods 60, 61 are provided, which are connected with the rotary lever 41 and are guided essentially parallel to the longitudinal axis of the sleeve 4, and which act on the yoke 63 which is connected with the ejection pipe 32.

At the lower end of the ejection pipe 32, in the area of the suction pipette 34, which seals the sleeve 4 downward, the ejector 33 is located. This consists essentially of an ejector body 65 with a lower guide bore 73 and a tong insertion 66 with an upper guide bore 72 and an ejector pin 67.

The ejector pin 67 is taken up by the ejector body 65 in such a way that one longitudinal area is guided in a middle bore 72 of the ejector body 65. Inside the ejector body 65 and coaxially to the ejector pin 67 a pressurestressed spiral spring 74 is arranged, whose one end is supported by the tong insertion 66 and whose other end is supported by a projection 75 which is firmly connected to the ejector pin 67, so that under prestress the latter is adjacent to the inner rim 76 of the recess 70.

The ejector 33 is connected as a premounted unit with the ejection pipe 32 and held by a holding bore 68.

A vacuum connection 77 in the yoke 63 which is connected with the ejection pipe 32, causes a vacuum on the inside of the ejection pipe 32. This is sealed towards the sleeve 4 through an O-ring 141, which is arranged on the circumference of the ejector body 65, and towards the suction bore 38 of the pipette 34 with a seal ring 80 of the ejector body 65, equipped with a sealing lip 79.

The seal ring 80, with a slightly compressed sealing lip 79, is adjacent to a pipette recess 81 in the lower dead position 54 of the ejection pipe 32 and thereby seals. The spiral spring 74 is arranged in such a way that the counteracting vacuum is overcome and also that a component which rests against the suction bore 38 is discharged by the ejector pin 67 springing out.

FIG. 9 shows another preferred design example of the transmission mechanism 17. In this case, the control lever 55, which is scanning the cam disc 36 by means of the scanning roll 35, is connected with the rotary lever 41 on the articulation point 50 through an actuator lever 130, a swivel lever 131 and a rod 132.

One end of the swivel lever 131, which is located in a swivel bearing 133 in the frame 1, is connected with the actuator lever 130 through a rotary joint 134, and its other end is articulated on the rod 132 through a joint connection 135. The rod 132 holds a tension spring 136 whose one end is hooked into the rod 132 and its other end is connected with the stroke lever 40.

In order to ensure that the rod 132 which is acted on by tensile load by a corresponding movement of the control lever 55, is relieved when the ejection device 31 is in neutral position, i.e. when the rotary lever 41 has been swiveled downward, the joint connection 135 is designed as a slot connection. The clearance available in this connection between a joint plug 139 and a slob 41 is sufficient in any case to balance the tolerances which may occur in the lever kinematics of the transmission mechanism 17 and to relieve the rod 132. This is the only way to ensure that the seal ring 80 of the ejection device 31 rests against the pipette recess 81 with the largest possible sealing force, created by the tension spring 136 to seal the vacuum.

In order to take up the control moments which stress the sleeve 4 due to the transmission mechanisms 14, 15, 16, 17, rolling bearings are provided in the lower and the upper sleeve guide 2, 3 to axially guide the sleeve. This prevents the sleeve to become canted in the bearing locations when sliding bearing assemblies are utilized.

The lower sleeve guide 2, in whose area the sleeve 4 has a square cross section, is provided with four ball bearings 82, 83, 84, 85, which are arranged on axes 86, 87, 88, 89 aligned vertically to the longitudinal direction of the sleeve 4. Two adjacent ball bearings 82, 83 are designed as double ball bearings and each holds a guide ring 94, 95 on each of their two outer rings 90, 91 and 92, 93, respectively.

Each of the ball bearings 82, 83, 84, 85 is arranged opposite a corner of the square cross section of the sleeve 4 and rolls with outer rings 96, 97 or their guide rings 94, 95, respectively, on steel pins 98, 99, 100, 101 which are arranged in the corners parallel to the longitudinal axis of the sleeve 4.

The steel pins 98, 99, 100, 101 are arranged in corresponding cutouts 102, 103, 104, 105 of the sleeve which is made of aluminum and are glued thereto.

In order to fix the swivel position of the sleeve 4 into place vis-a-vis the rotary star 6 the guide ring 94 is provided with a V-shaped cut cross section. This achieves a double sided installation of the guide ring 94 to the steel pin 98, which determines precisely the alignment of the sleeve 4 towards the rotary star 6 on the level vertically to the longitudinal axis of the sleeve 4.

To permit a readjustment of the guide, the axes 88, 89 of the adjacent ball bearings 84, 84 are designed as excenters 106, 107, so that the distance of the ball bearings 84, 85 to the longitudinal axis of the sleeve 4 is adjustable by rotating the axes 88, 89. This adjustment can be fixed into position by setscrews 108, 109.

The ball bearings 82, 83, equipped with the guide rings 94, 95 are provided with adjustment devices 110, 111, each consisting of two setscrews 116, 117 and 118, 119, respectively, which are arranged on either side of the ball bearings 82, 83 and which act on the axes 86, 87 through spring cushions 112, 113 and 114, 115, respectively.

This arrangement has the advantage that, due to the spring force, a tight fit of two ball bearings 82, 84 and 83, 85, respectively, which are opposite each other, is achieved without the danger of overloading the bearings.

In the area of the upper sleeve guide 3 the sleeve 4 has an annulus cross section. Therefore, three ball bearings 123, 124, 125, which are arranged on axes 120, 121, 122 and spaced evenly around the sleeve 4, are sufficient for a precise axial guiding. In order to maintain the tolerance balance of the bores and an elastic prestressing the axis 120 of the ball bearing 123 is located in rubber rings 126, 127.

For the radial bearing arrangement of the upper sleeve guide 3 in the frame 1 of the assembly head the sleeve guide 3 is designed as a bearing holder 128 in a ball ring guide 129 in one area.

Of course, it is conceivable to design the control element of the transmission mechanism 17, which is designed as a steel band 52 or a lever 130, respectively, as a light duty component with its structure oriented in the direction of the load. The use of fiber enforced plastic materials is particularly suitable. Since their specific stress factors in part are significantly above the corresponding steel factors, an even larger reduction of mass could be achieved.

The design of the invention does not limit itself to the above preferred design example. A number of alternatives is conceivable, which are using the solution as shown even when the design is basically different.

I claim:

1. Assembly head for handling devices for programmed automatic mounting of components on a workpiece comprising
   a frame (1), a rotary star (6) having a central bore (5) and mounted in the assembly head, a sleeve (4) which slides longitudinally in the central bore (5) of the rotary star, at least one pair of tongs (18, 19) which pivot in the direction of a suction pipette (34) arranged at the lower end of the sleeve and which hold and adjust the component, and an ejection device (31) which is guided in the sleeve and actuated by a transmission mechanism (17) in synchronization with the movement of the sleeve (4) so as to eject a component held by the assembly head and to stop the suction of the suction pipette (34), distinguished by the fact that the ejection device (31) guided in the sleeve (4) can be actuated by a control element (52, 130) acted on by a tensile load.

2. Assembly head according to claim 1, distinguished by the facts that the control element (52, 130) is a component of the transmission mechanism (17), which is articulated on the frame (1) of the assembly head, to actuate the ejection device (31) in such a way that the control element (52, 130) serves as a non-positive connection of a control lever (55) driven by a cam disc (36), to a rotary lever (41) which actuates the ejection device (31) by push-rods (60, 61), the rotary lever (41) being connected with a stroke lever (40) in a swivel joint (42), whereby the rotary lever can be rotated, which makes the sleeve (4) movement possible.

3. Assembly head according to claim 2, distinguished by the fact that the control element is designed as a steel band.

4. Assembly head according to claim 3, distinguished by the facts that the control lever (55) and the stroke lever (40) are arranged opposite each other on either side of the sleeve (4), and that the steel band (52) is redirected in the area of the stroke lever (40) which holds a swivel bearing (39).

5. Assembly head according to claim 3, distinguished by the fact that a tension spring (51), which is attached to the stroke lever (40), acts on an articulation point (50) of the steel band (52) on the rotary lever (41), which forces the latter into a knee-point position toward the stroke lever (40), which forms a stop for the swivel movement of the rotary lever (41) and stops the sleeve.

6. Assembly head according to claim 3, distinguished by the fact that the steel band's (52) angle of contact ends at the bearing mid-position of a swivel bearing (39) which serves to house the stroke lever (40).

7. Assembly head according to claim 2, distinguished by the fact that the rotary lever (41), which is arranged parallel to the stroke lever (40), holds axle necks (43) of a stroke ring (28) which encircles the sleeve (4) and serves to articulate the stroke lever (40) thereto, in slots (46, 47) on its two arms (44, 45).

8. Assembly head according to claim 1, distinguished by the fact that the control element is designed as a steel band (52).

9. Assembly head according to claim 1, distinguished by the fact that the control element is designed as an actuator lever (130) and repeats the movement of a steel band.

10. Assembly head according to claim 9, distinguished by the fact that the control element (130) connects a control lever (55) with a swivel lever (131), which in turn is connected with a rod (132), which is articulated to a rotary lever (41), and which is loaded by a tension spring (136), through a joint connection (135).

11. Assembly head according to claim 10, distinguished by the fact that the joint connection (135) consists of a joint plug (139) of the rotary lever (131), which is guided in a slot (140) on the rod (132).

12. Assembly head according to claim 11, distinguished by the fact that the tension spring (136) is hooked onto the rod (132) and whose one end is connected with the stroke lever (40).

13. Assembly head according to claim 1, distinguished by the fact that the sleeve (4) is guided in rolling bearings and can be moved axially.

14. Assembly head according to claim 13, distinguished by the fact that the sleeve (4) is guided in ball bearings (82-85; 123-125), both in a lower sleeve guide (2) and in an upper sleeve guide (3) and can be moved longitudinally.

15. Assembly head according to claim 14, distinguished by the fact that the sleeve (4), which is provided with an annulus cross section in the area of the upper sleeve guide (3), is guided axially in three ball bearings (123-125), which are evenly spaced around the sleeve (4), in a bearing holder (128), whereby the latter is held in a ball ring guide (129).

16. Assembly head according to claim 14, distinguished by the fact that the sleeve (4), which has a square cross section in the area of the lower sleeve guide (2), is guided in four ball bearings (82..85), each of which is assigned to a corner of the square cross section, whereby steel pins (98-101), which extend in longitudinal direction of the sleeve (4), are provided in the corners.

17. Assembly head according to claim 1, distinguished by the fact that two ball bearings (82, 83), which are designed as prestressed double ball bearings, are each provided with two outer rings (90, 91; 92, 93) each to house one guide ring (94, 95), at least one of which has a V-shaped cut section for two-point installation on a steel pin (98, 99).

18. Assembly head according to claim 17, distinguished by the fact that the ball bearings (82-85) are adjustable in regard to their distance from the sleeve's longitudinal axis.

* * * * *